United States Patent

Thakur et al.

[11] Patent Number: 6,013,566
[45] Date of Patent: *Jan. 11, 2000

[54] METHOD OF FORMING A DOPED REGION IN A SEMICONDUCTOR SUBSTRATE

[75] Inventors: Randhir P. S. Thakur; Howard E. Rhodes, both of Boise, Id.

[73] Assignee: Micron Technology Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/741,851

[22] Filed: Oct. 29, 1996

[51] Int. Cl.[7] .................................................. H01L 21/265
[52] U.S. Cl. ........................................... 438/513; 438/514
[58] Field of Search .................................... 438/510, 513, 438/514, 517, 518, 522, 530, 532, 160, 301, 305, 928, 977, FOR 461, FOR 150; 250/492.21; 148/DIG. 144

[56] References Cited

U.S. PATENT DOCUMENTS

| | | | |
|---|---|---|---|
| 4,937,205 | 6/1990 | Nakayama et al. | 438/513 |
| 5,162,241 | 11/1992 | Mori et al. | 438/143 |
| 5,270,250 | 12/1993 | Murai et al. | 438/513 |
| 5,403,756 | 4/1995 | Yoshinouchi et al. | 438/528 |
| 5,422,305 | 6/1995 | Seabaugh et al. | 438/480 |
| 5,448,081 | 9/1995 | Malhi | 257/77 |
| 5,466,949 | 11/1995 | Okuno | 257/25 |
| 5,561,072 | 10/1996 | Saito | 438/513 |
| 5,602,047 | 2/1997 | Tsai et al. | 438/160 |
| 5,672,541 | 9/1997 | Booske et al. | 438/513 |
| 5,897,363 | 4/1999 | Gonzalez et al. | 438/527 |

OTHER PUBLICATIONS

Mattiussi, G.A., et al., "The Effect of Implant and Rapid Thermal Annealing Temperatures on Ion Beam Mixing of Titanium Silicide", *Mat. Res. Soc. Symp. Proc.*, vol. 76, Materials Research Society, pp. 323–329, (1987).

*Primary Examiner*—Savitri Mulpuri
*Attorney, Agent, or Firm*—Schwegman, Lundberg, Woessner & Kluth P.A.

[57] ABSTRACT

A method for implanting shallow regions in a semiconductor substrate comprises heating the backside of the substrate with a lamp or other heating method, and implanting the frontside of the substrate using plasma doping. In a further embodiment, the frontside of the substrate is also heated, using rapid thermal processing during implantation. Implantation damage is simultaneously annealed during implantation, so that a subsequent anneal, if needed at all, is done using rapid thermal annealing.

8 Claims, 3 Drawing Sheets

METHOD OF FORMING A DOPED REGION IN A SEMICONDUCTOR SUBSTRATE

FIELD OF THE INVENTION

The present invention relates to methods for forming semiconductor structures, and in particular, for forming shallow, implanted regions in semiconductor structures.

BACKGROUND OF THE INVENTION

Semiconductor devices contain regions or junctions "doped" with ions of a different composition than the bulk material. Several techniques are available to form doped regions. Of these techniques, ion implantation is the most common. Ions are injected into semiconductor surfaces at an energy and dose to achieve desired junction depths. Such implant energies and implant doses are selected according to the desired junction depth. Implant energies also vary with the type of ion being implanted.

Using ion implantation is advantageous over diffusion doping, another doping technique. Diffusion doping requires clean surfaces, free of contaminants and other defects, which can act as diffusion barriers. Furthermore, diffusion doping does not allow for precise control of the number of diffused dopant species.

One challenge while using ion implantation is that it creates lattice damage due to the high energy required to implant ions to certain depths. When implanted ions enter a semiconductor substrate, they undergo numerous scatterings, displacing atoms in the lattice along the way. The path which an ion makes through a semiconductor substrate is marked with lattice defects, such as vacancies, interstitials, and/or dislocations. Subsequent annealing steps are needed to remove the damage due to implanted ions.

Annealing time varies, depending on the implant energy used and the type of ions implanted. Longer annealing times can present a problem in that dopants tend to migrate, often farther than they should, resulting in deeper junctions and smaller dopant gradients, when heat is applied. The longer a structure is held at a certain temperature, the more time dopants have to migrate into undesired areas. When lattice damage is severe enough, it is often impossible to reduce the lattice defects to a desirable level without disrupting other regions in a structure. While raising the annealing temperature shortens the time period required to reduce lattice defects in a structure, this does not cure the problem associated with annealing because dopants tend to migrate at a faster rate into undesired areas. When considering annealing steps, it is also important to keep in mind the thermal budget of the process. More heat or a longer annealing time increases the thermal budget. Thus, subsequent thermal steps have to be ignored completely, often resulting in not being able to completely fabricate a manufacturable circuit.

As semiconductor integrated circuits (ICs) are becoming more dense, scaled devices with reduced feature sizes are much more sensitive and control of fabrication parameters is more stringent. Moreover, doped regions within devices are also becoming much shallower. Problems associated with ion implantation discussed above make it even more difficult to precisely control the depth of implanted ions in shallow regions and keep these regions free from any damage. Implanted ions travel in a path through an implanted substrate, which often comprises ions which straggle from desired paths due to inconsistencies in the number of scatterings that occur in its path. Straggle causes implanted ions to migrate into regions outside of the narrow perimeter in which ions are being implanted. Furthermore, surface and junction damage created by ion implantation is even more difficult to remove. Long, high temperature anneals required to remove such lattice damage are even more of a problem due to the smaller distances which dopants have to travel before they migrate into undesired areas.

Due to the trend of decreasing device sizes in ICs, there is a need for doping shallow regions in semiconductor structures in a manner in which damage due to ion implantation is prevented. Long, high-temperature anneals can degrade device performance. Therefore, there is a need to prevent the need for such damage anneals, by preventing damage during implantation. There is a further need for decreasing the thermal budget required for forming such doped regions.

SUMMARY OF THE INVENTION

The present invention teaches a method and apparatus for implanting semiconductor substrates, without severely damaging the lattice structure. By heating the chuck, which holds the semiconductor substrate, while implanting the substrate, subsequent anneals, if needed at all, can be performed at much lower temperatures because many defects are not formed at all using the method of the invention. This results in a tremendous savings in the thermal budget for a manufacturing process.

Plasma doping is used to implant shallow regions in semiconductor substrates. Plasma ions gain an excitation energy, which is variable, needed to implant to certain depths, by applying an adjustable rf-induced voltage to certain reactant gases at a level associated with desired implant depths. The reactant gases comprise material to be implanted in the semiconductor substrate and a carrier gas, such as argon and other inert gases. Excitation energies used in plasma doping are smaller than conventional implantation energies. Thus, implanted atoms using plasma doping do not have a tendency to straggle into areas outside of a desired implant area. Furthermore, such lower energies do not damage the lattice structure when combined with heating the substrate.

This invention is crucial to meet the demands of doping shallow regions in semiconductor structures. Structures resulting from the application of the invention, such as source/drain regions in dynamic random access memory (DRAM) transistors and elevated source/drain regions, function more efficiently due to their lower defect densities. In DRAMs, refresh time is improved by producing defect-free source/drains in the DRAM transistors. As devices are becoming smaller, and they are required to perform more functions, it is important that they function in a time-efficient manner. Demands for faster devices require that regions within a device be fabricated with as low of a defect density as possible. Furthermore, resulting structures are not plagued by unwanted dopant migration, induced by long, high-temperature anneals required to alleviate lattice defects created when using prior art techniques.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Typically, implant regions are needed for forming various junctions in semiconductor integrated circuit (IC) fabrication. Thus, this invention will be described with reference to implanting junctions, and in particular to implanting source/drain regions in transistors. Elevated source/drain regions are also implanted using the method of this invention. However, the scope of the invention is not to be narrowed by this example. Shallow implants into any semiconductor device, to form any type of region, can be performed using the invention.

Figure 1A:
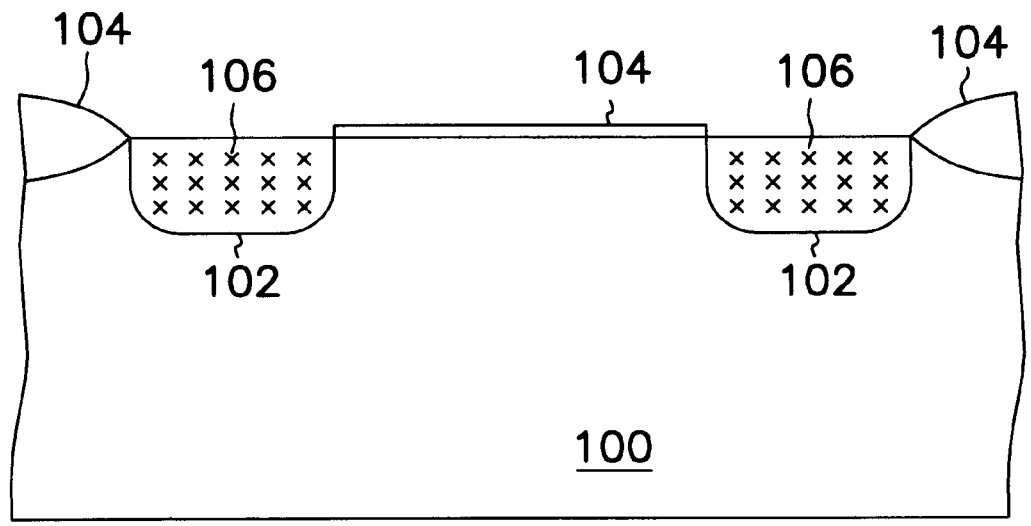
FIG. 1A is a cross-sectional representation of a prior art implanted semiconductor substrate structure, which is afflicted with damaged regions in the implant zone.
Figure 1B:
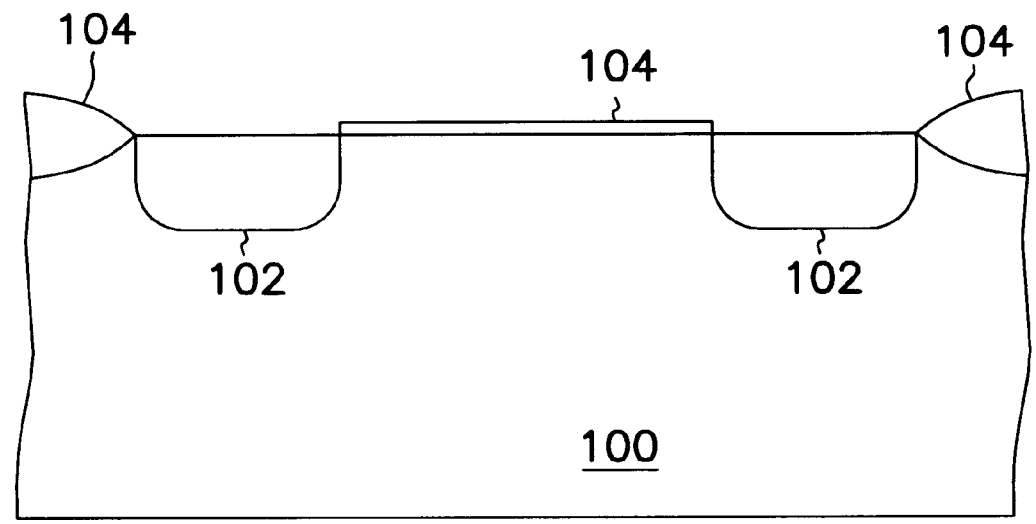
FIG. 1B is a cross-sectional representation of an implanted semiconductor substrate structure formed in accordance with the invention, which is relatively free of implant-created damage in the implant zone.

FIGS. 1A and 1B illustrate the effects of using the method of the invention to form implanted zones 102 in a substrate 100 in active regions defined by isolating material 104, such as oxide formed using a LOCOS (LOCal Oxidation of Silicon) process as well known to one skilled in the art. FIG. 1A illustrates a prior art implanted zone 102, afflicted with damaged regions 106, which disadvantageously affect device performance. FIG. 1B illustrates implanted zones 102, relatively free of implant-created damage, formed using the method of the invention.

Figure 2A:
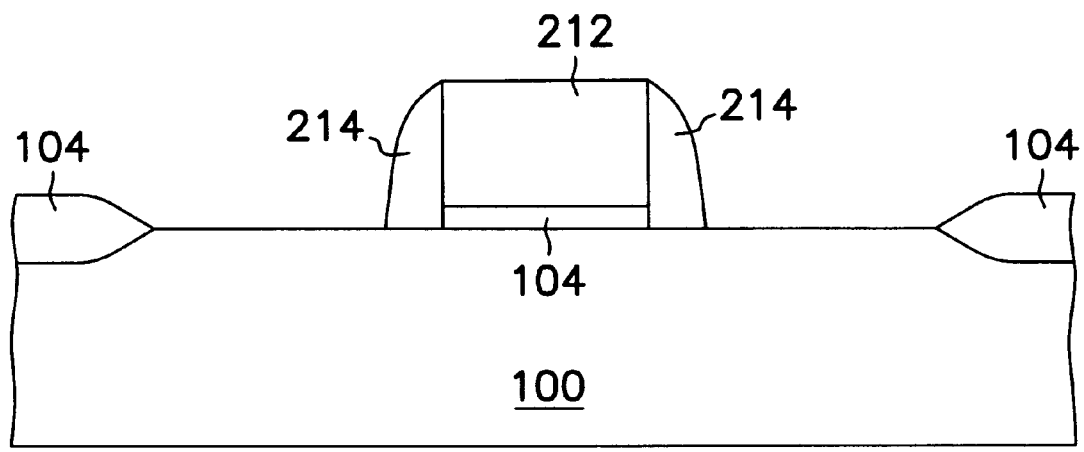
FIG. 2A is a cross-sectional representation of a semiconductor substrate structure, which is subsequently implanted using the method of the invention.
Figure 3A:
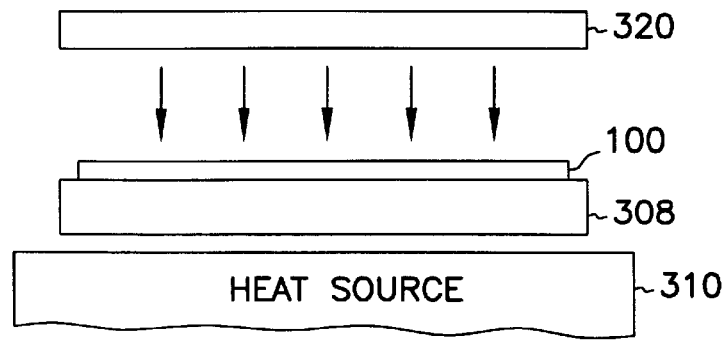
FIG. 3A is a cross-sectional representation of a substrate heating setup, used in the present invention.

In practicing the invention to form a transistor, a semiconductor substrate, a portion of which is represented by 100 in FIG. 2A, is placed on a chuck 308, which is heated using a lamp 310 disposed on the backside of the substrate 100, as shown in FIG. 3A. However, other heating sources 310 can be used, such as resistive heaters. Gates 212, typically having spacers 214 formed along the sides, and insulating oxide 104 define the boundaries of the implanted region to be formed. The lamp 310 used to heat the substrate 100 is any type of lamp, which emits electromagnetic radiation (e.g. tungsten-halogen lamps, etc.), having a wavelength in the spectrum from ultraviolet to far infrared. For example, the lamp 310 can be an ultraviolet, infrared, mercury, or tungsten-halogen type lamp. Compared to prior art techniques of heating a chuck 308 using resistive coils, this method provides faster heating over the entire substrate 100. Uniformly heating the substrate 100 is necessary for uniformity of subsequent implant depths.

The chuck 308, on which the substrate 100 is placed, can be rotatable for more even heating and deposition. If a rotatable chuck 100 is used, it is rotated at a speed approximately greater than 1 r.p.m. Substrates 100, or wafers, utilized in this invention can be large, up to approximately 18 inches in diameter. Implants of light and heavy doses are performed in the frontside of the substrate 100, depending on the type of device and junction being formed. This invention is applicable to both light and heavy implant doses.

Figure 3B:
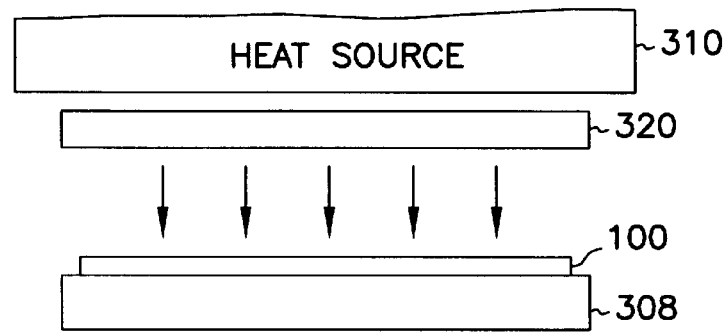
FIG. 3B is a cross-sectional representation of a further embodiment of a substrate heating setup, used in the present invention.
Figure 3C:
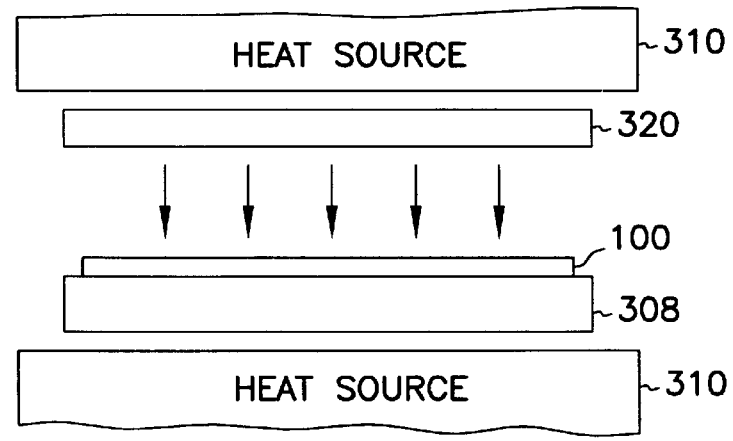
FIG. 3C is a cross-sectional representation of a further embodiment of a substrate heating setup, used in the present invention.

In a further embodiment, heating is performed during the implant step, using rapid thermal processing (RTP). RTP is accomplished using front side heating as shown in FIG. 3B, using a similar heat source 310 as is used to heat the backside of the substrate 100, as shown in FIG. 3A. We specifically claim the RTP-assisted heating because of the faster heating and cooling of the chuck 308, but other methods of heating are also part of this invention. While there may be some residual heating due to the plasma itself, this invention accomplishes heating of the substrate 100 using an additional heat source 310. In yet a further embodiment, as shown in FIG. 3C, both RTP and backside substrate 100 heating are used during implantation.

Figure 2B:
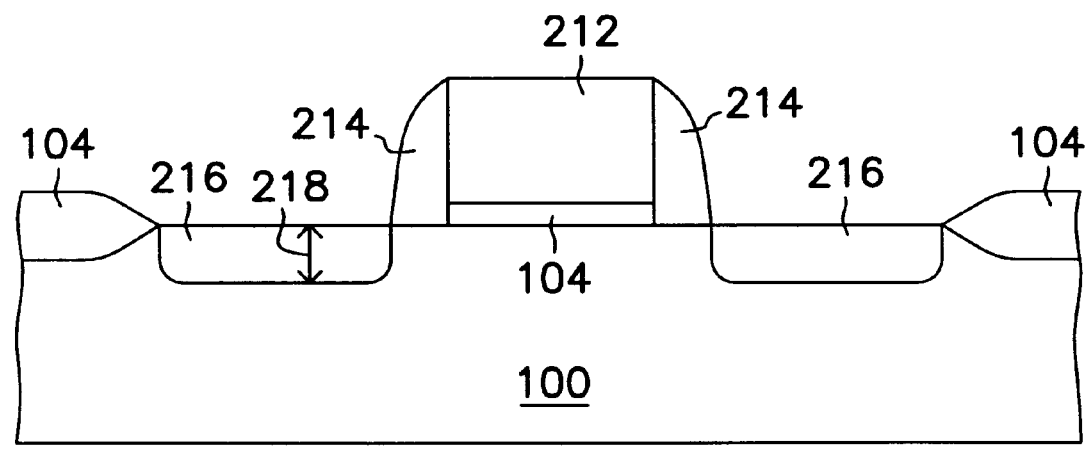
FIG. 2B is a cross-sectional representation of an implanted semiconductor substrate structure formed in accordance with the method of the invention.

When forming shallow, doped regions 216, as shown in FIG. 2B, in dynamic random access memory (DRAM) structures, microprocessors, Group III–V substrates (ex., gallium arsenide (GaAs) and indium phosphides), Group II–VI substrates, silicon-on-insulator structures, selectively grown elevated source/drain regions, and other semiconductor structures, where shallow implants are required, this invention is crucial to forming structures with low defect densities. In particular, low defect densities are required for high mobility transistors. As an example, defect-free DRAM regions improve refresh time of the device. Defects in DRAMs provide leakage paths, which degrade device performance. As devices are becoming smaller, junction depths are also decreasing in size. For example, for approximately 0.18 micron DRAM feature 212 sizes, source/drain junction depths 218 are approximately 1,000 angstroms or less. However, shallow implants of between approximately 100 to 1,000 angstroms are done, using the method of the invention.

In one embodiment, an indium phosphide substrate, as shown in FIGS. 2A and 2B is implanted. The substrate comprises any indium phosphide or similar material, including: indium phosphide; gallium phosphide; ternary materials, such as indium gallium phosphide; and quaternary materials, such as indium gallium arsenide phosphide. An indium phosphide substrate, a portion of which is shown by 100 is placed on a chuck 308 in a process chamber. The substrate 100 can be any reasonable size, depending on its constituent material.

A lamp 310, as shown in FIG. 3A, is used to heat the substrate 100, as shown in FIGS. 2A and 2B, during implantation. The lamp 310 comprises an ultraviolet, mercury, or tungsten-halogen type lamp. The lamp 310, placed on the backside of the substrate 100, heats the substrate 100 to a temperature of approximately 500 to 600 degrees Celsius, or more, depending on the type of substrate material used. Lower temperatures can be used, depending on the excitation energy of the plasma, the desired defect density, and implant depth 218. For example, the substrate 100 is heated to temperatures as low as approximately 150 degrees Celsius when a low defect density is not as critical, when the implant depth 218 is not as deep, or when the excitation energy of the plasma is lower, causing less lattice damage during implantation. The excitation energy of the plasma is selected according to principles well known to one skilled in the art to obtain an implant depth 218 and junction as desired. The implantation time is also selected according to principles well known to one skilled in the art, varying depending on implant dose, implant energy, and junction depth 218 desired.

Dopants, such as zinc to form a p-doped region, are implanted from source 320, as shown in FIG. 3A, into the indium phosphide substrate 100 to form a shallow implanted region 216, as shown in FIG. 2B. However, any dopant can be implanted to form a shallow doped region 216, as is well known in the art. Implants are performed in the front surface of the substrate 100, using a plasma doping (PLAD) technique and PLAD apparatus as well known to one skilled in the art. A plasma is formed in a chamber from reactant gases. The reactant gases are selected, such that they comprise elements, which are to be implanted, and a carrier gas, such as an inert gas like argon. The plasma is formed, using a radio frequency (rf)-induced glow discharge, which transfers energy to the reactant gases. Some of the ions are implanted in the substrate 100, due to their increased energies. Excitation energy of the plasma is varied as well known to one skilled in the art to provide the proper implant depth 110 and energies of the ions comprising the plasma.

When implanting shallow regions 216, the energy needed to perform implants is small enough that PLAD is sufficient to obtain the proper concentrations of dopants, at the proper depths 218, as shown in FIG. 2B. However, excitation energy is varied according to the precise depth 218 of implant required. PLAD implants for shallow source/drain junctions 216 of approximately 100 to 1,000 angstroms allow for high mobility transistors to be fabricated with smaller dimensions than in the past. Compared to conventional implantation techniques, the implanted surface 216 does not become amorphous during implantation. Amorphous materials require longer annealing times and higher temperatures to recrystallize. In the method of the invention, implanted surfaces 216 recrystallize simultaneously with implantation. Therefore, subsequent anneals are not always needed, when using the method of this invention.

By heating the chuck 308, which holds the semiconductor substrate 100, simultaneously with implanting the substrate 100, as shown in FIG. 3A, subsequent anneals, if needed at all, can be performed at much lower temperatures. If needed, subsequent anneals comprise rapid thermal annealing (RTA) to repair remaining lattice damage. By eliminating the need for anneals subsequent to implantation, or by using RTA, long anneals at high temperatures are eliminated. This results in a tremendous saving in the thermal budget for a manufacturing process.

A furnace reflow is an alternative to RTA. However, using a furnace reflow does not provide the degree of savings in thermal budget that is associated with RTA. Furthermore, the upper limit of the temperature at which furnace reflow can occur depends on the capabilities of the equipment. Therefore, even longer furnace reflows may be needed, depending on the type of equipment used.

In another embodiment, a gallium arsenide substrate 100, as represented in FIGS. 2A and 2B, is implanted. A gallium arsenide substrate, a portion of which is shown by 100 is placed on a chuck 308 in a process chamber. The substrate 100 can be any reasonable size, depending on its constituent material. The substrate 100 is implanted using the same PLAD techniques and substrate 100 heating mechanisms as described previously.

In yet another embodiment, a silicon substrate 100 is implanted. A silicon substrate, a portion of which is shown by 100 is placed on a chuck 308 in a process chamber. The substrate 100 can be any reasonable size, depending on its constituent material. The substrate 100 is implanted using the same PLAD techniques and substrate heating mechanisms as described previously.

Although use of plasma conventionally is limited by its inherent introduction of contaminants, such as metallic elements, carbon, sodium, and calcium into layers formed using plasma techniques, this invention overcomes that problem. Heating the substrate during implantation prevents contaminants from attaching to lattice sites, forming defects within implanted regions. Such defects are continuously annealed out during implantation.

Adding a heated substrate during implantation promotes solid phase epitaxial recrystallization. Furthermore, due to the heated substrate, contamination is eliminated by a gettering mechanism. Impurities migrate to the backside of a substrate, during annealing. Then, a layer of material, containing the impurities, is etched from the backside of the substrate after the implantation step. Using this invention, implanted substrates have minimal damage to recover from during subsequent annealing steps. Any damage that is present is controlled, and not as deep in the lattice as when using conventional techniques. This results in an overall reduction in thermal budget.

It should be noted that in MOS technology, many times certain areas of the semiconductor die described as having a particular doping, could quite easily be of a different doping, promoting a different type of charge carrier. In such instances, if one were to reverse the primary carriers in all areas of the die and adjust for carrier mobility, the invention would operate in the same manner as described herein without departing from the scope and spirit of the present invention.

It is to be understood that the above description is intended to be illustrative, and not restrictive. Many other embodiments will be apparent to those of skill in the art upon reviewing the above description. This invention is applicable to implanting any shallow regions in semiconductor structures, with any type of dopant, where alleviating lattice damage is a primary concern. The scope of the invention should, therefore, be determined with reference to the appended claims, along with the full scope of equivalents to which such claims are entitled.

What is claimed is:

1. A method for forming a shallow, doped source/drain region for a semiconductor transistor structure in a semiconductor substrate combining uniform RTP to facilitate solid phase epitaxial recrystallization, simultaneous with ion implantation, while conserving the thermal budget and eliminating the need for subsequent lattice repair anneals, comprising the steps of:

heating the semiconductor substrate to approximately 600 degrees Celsius using uniform RTP by using a lamp selected from the group consisting of: an ultraviolet lamp, a mercury lamp, and a tungsten-halogen lamp, to heat at least one of a frontside and a backside of the semiconductor substrate; and simultaneously implanting the heated semiconductor substrate with a dopant, to form the shallow, doped source/drain region having a depth of approximately 100 to 1,000 angstroms.

2. The method of claim 1, wherein the semiconductor transistor structure is a dynamic random access memory transistor.

3. The method of claim 1, wherein the semiconductor substrate is selected from the group consisting: of gallium arsenide, indium phosphide, indium gallium phosphide, indium gallium arsenide phosphide, and silicon.

4. The method of claim 1, wherein the implanting step, which uses plasma doping, comprises forming a plasma from reactant gases using a radio frequency-induced glow discharge that transfers energy to the reactant gases.

5. The method of claim 1, wherein the radio frequency-induced glow discharge is varied to produce a plasma, having ions of a proper excitation energy to be implanted to a desired depth in the semiconductor substrate.

6. The method of claim 1, wherein amorphous regions are not formed simultaneously with the implanting step.

7. The method of claim 1, further comprising the step of removing a layer of impurities from the backside of the semiconductor substrate after the implanting step.

8. A method for forming a doped region in a semiconductor substrate having a frontside and a backside, comprising the steps of:

heating the semiconductor substrate located in a plasma doping chamber using a first lamp opposing the frontside of the substrate within the plasma doping chamber and a second lamp opposing the backside of the substrate within the plasma doping chamber, wherein the first and second lamps are selected from the group consisting of: an ultraviolet lamp, a mercury lamp, and a tungsten-halogen lamp, and wherein the first lamp and the second lamp uniformly heat the substrate to a temperature between 500 and 700 degrees Celsius using rapid thermal processing (RTP); and implanting a dopant in the substrate, using plasma doping, while a temperature of the substrate is raised to a temperature between 500 and 700 degrees Celsius such that solid phase epitaxial recrystallization of the substrate occurs during the implanting of the dopant.

* * * * *

UNITED STATES PATENT AND TRADEMARK OFFICE
CERTIFICATE OF CORRECTION

PATENT NO. : 6,013,566
DATED : January 11, 2000
INVENTOR(S) : Randhir P.S. Thakur et al.

It is certified that error appears in the above-identified patent and that said Letters Patent is hereby corrected as shown below:

Column 7,
Line 5, delete "claim 1", and insert -- claim 4 --, therefor.

Signed and Sealed this

Eleventh Day of December, 2001

Attest:

NICHOLAS P. GODICI
Attesting Officer
Acting Director of the United States Patent and Trademark Office